US006864710B1

(12) United States Patent
Lacey et al.

(10) Patent No.: US 6,864,710 B1
(45) Date of Patent: Mar. 8, 2005

(54) PROGRAMMABLE LOGIC DEVICE

(75) Inventors: Timothy M. Lacey, Bedford, NH (US); David L. Johnson, Pleasanton, CA (US)

(73) Assignee: Cypress Semiconductor Corp., San Jose, CA (US)

(*) Notice: Subject to any disclaimer, the term of this patent is extended or adjusted under 35 U.S.C. 154(b) by 0 days.

(21) Appl. No.: 09/475,879

(22) Filed: Dec. 30, 1999

(51) Int. Cl.$^7$ .............................................. H03K 19/177
(52) U.S. Cl. .............................. 326/39; 326/41; 326/47
(58) Field of Search .............................. 326/38–41, 46, 326/47

(56) References Cited

U.S. PATENT DOCUMENTS

| 4,878,200 | A | | 10/1989 | Asghar et al. ......... 365/189.02 |
|---|---|---|---|---|
| 5,136,188 | A | | 8/1992 | Ha et al. ..................... 307/465 |
| 5,144,582 | A | | 9/1992 | Steele .................... 365/189.08 |
| 5,280,202 | A | | 1/1994 | Chan et al. ................. 307/465 |
| 5,384,745 | A | | 1/1995 | Konishi et al. ........ 365/230.03 |
| 5,422,823 | A | | 6/1995 | Agrawal et al. ............. 364/489 |
| 5,451,887 | A | | 9/1995 | El-Avat et al. ................ 326/39 |
| 5,455,525 | A | | 10/1995 | Ho et al. ...................... 326/41 |
| 5,521,529 | A | | 5/1996 | Agrawal et al. .............. 326/41 |
| 5,537,057 | A | | 7/1996 | Leong et al. .................. 326/41 |
| 5,587,945 | A | | 12/1996 | Lin et al. ................. 365/185.1 |
| 5,646,901 | A | | 7/1997 | Sharpe-Geisler et al. ... 365/218 |
| 5,689,195 | A | * | 11/1997 | Cliff et al. ..................... 326/41 |
| 5,781,030 | A | | 7/1998 | Agrawal et al. .............. 326/39 |
| 5,799,176 | A | | 8/1998 | Kapusta et al. ............. 395/556 |
| 5,811,987 | A | | 9/1998 | Ashmore, Jr. et al. ........ 326/39 |
| 5,818,254 | A | | 10/1998 | Agrawal et al. .............. 326/39 |
| 5,848,285 | A | | 12/1998 | Kapusta et al. ........ 395/800.01 |
| 5,933,023 | A | * | 8/1999 | Young .......................... 326/40 |
| 5,966,027 | A | | 10/1999 | Kapusta et al. .............. 326/39 |
| 5,977,791 | A | * | 11/1999 | Veenstra ...................... 326/40 |
| 6,049,223 | A | | 4/2000 | Lytle et al. ................... 326/40 |
| 6,049,225 | A | * | 4/2000 | Huang et al. ................. 326/41 |
| 6,058,452 | A | | 5/2000 | Rangasayee et al. ........ 711/108 |
| 6,130,552 | A | * | 10/2000 | Jefferson et al. .............. 326/39 |
| 6,134,181 | A | | 10/2000 | Landry ....................... 365/233 |
| 6,137,308 | A | | 10/2000 | Nayak .......................... 326/39 |
| 6,181,163 | B1 | * | 1/2001 | Agrawal et al. .............. 326/41 |
| 6,191,998 | B1 | | 2/2001 | Reddy et al. .......... 365/230.05 |
| 6,201,407 | B1 | | 3/2001 | Kapusta et al. ............... 326/39 |
| 6,271,679 | B1 | * | 8/2001 | McClintock et al. ......... 326/38 |

OTHER PUBLICATIONS

"Hybrid Product Term and Lut Based Architectures Using Embedded Memory Blocks", By Frank Heile and Andrew Leaver, pp. 13–16.

"An Innovative, Segmented High Performance FPGA Family with Variable–Grain–Architecture and Wide–Gating Functions", By Om Agrawal et al., pp. 17–26.

"A New High Density and Very Low Cost Reprogrammable FPGA Architecture", By Sinan Kaptanoglu et al., pp. 3–12.

"XC4000E and XC4000X Series Field Programmable Gate Arrays", XILINX, May 14, 1996 (Version 1.6), pp. 6–5 to 6–72.

"XC4000XLA/XV Field Programmable Gate Arrays", XILINX, Oct. 18, 1999, pp. 6–157 to 6–170.

"VIRTEX™ 2.5V Field Programmable Gate Arrays", XILINX, Apr. 2, 2001, pp. 1–20.

"COOLRUNNER® XPLA3 CPLD", XILINX, Apr. 11, 2001, pp. 1–10.

(List continued on next page.)

Primary Examiner—Anh Q. Tran
(74) Attorney, Agent, or Firm—Christopher P. Maiorana, PC

(57) ABSTRACT

A programmable logic device comprising one or more horizontal routing channels, one or more vertical routing channels, and a logic element. Each logic element may be configured to connect between one of the horizontal routing channels and one of the vertical routing channels. The logic element may comprise a logic block cluster and a memory block.

32 Claims, 12 Drawing Sheets

OTHER PUBLICATIONS

"Spartan and Spartan–XL Families Field Programmable Gate Arrays", XILINX, Mar. 2, 2000, pp. 4–1 to 4–66.

"XC9500XV Family High–Performance CPLD", XILINX, Jan. 15, 2001, pp. 1–18.

"Integrated Product–Term Logic in Apex 20K Devices", Altera, Apr. 1999, ver. 1.0, pp. 1–12.

"Apex II Programmable Logic Device Family", Altera, May 2001, ver. 1.1, pp. 1–96.

"Flex 8000 Programmable Logic Device Family", Altera, Jun. 1999, ver. 10.01, pp. 349–410.

"MAX 7000 Programmable Logic Device Family", Altera, Mar. 2001, ver. 6.1, pp. 1–62.

"MAX 9000 Programmable Logic Device Family", Altera, Jul. 1999, ver. 6.01, pp. 1–40.

"FLEX 10K Embedded Programmable Logic Device Family", Altera, Mar. 2001, ver. 4.1, pp. 1–128.

"Mach 5 CPLD Family—Fifth Generation Mach Architecture", Lattice Semiconductor Corp., Rev. 1, Sep. 2000, p. 1–47.

* cited by examiner

PROGRAMMABLE LOGIC DEVICE

CROSS-REFERENCE TO RELATED APPLICATIONS

The present invention may relate to co-pending application Ser. No. 09/475,808, filed concurrently, which is hereby incorporated by reference in its entirety.

FIELD OF THE INVENTION

The present invention relates to programmable logic at devices generally and, more particularly, to a programmable logic device architecture that may combine the high-speed, predictable timing, and ease of use of a complex programmable logic device (CPLD) with the high density and low power of a field programmable so gate array (FPGA).

BACKGROUND OF THE INVENTION

Traditionally there are two types of programmable logic architectures: complex programmable logic device (CPLDs) and field programmable gate arrays (FPGAs). The CPLD can be constructed as a one-dimensional array of logic blocks made of 16 macrocells and a product term array connected through a single central interconnect scheme. The CPLD achieves high performance by being able to complete a complex logic function in a single-pass of the logic array and has predictable timing by having every output or I/O pin connected to every logic block input through the central interconnect structure. The CPLD can be non-volatile by using an EEPROM process.

However, the architecture of the conventional CPLD has disadvantages. A complex process technology limits performance and increases cost. A high standby power limits capacity and applications. The conventional CPLD has no available on-chip RAM. The maximum capacity of the conventional CPLD is limited by interconnect structure performance, power, technology and die cost. The core voltages, I/O voltages, and I/O standards of the conventional CPLD are not flexible. The I/O cells need a synchronous output enable (OE) to support a synchronous circuit architecture with minimal bus latency (e.g., as found in NoBL™ SRAMs manufactured by Cypress Semiconductor Corp. or ZBT™ devices manufactured by Integrated Device Technology) memory.

An FPGA architecture is constructed from a two dimensional array of logic blocks called CLBs. The CLBs are made from 4-input look-up-tables (LUTs) and flip-flops. The LUTs can be used as distributed memory blocks. The CLBs are connected by a segmented interconnect structure. The FPGA architecture supports a low standby power and the LUTs can use a simple logic CMOS process. Since the two-dimensional array of CLBs and the segmented interconnect structure are scalable, the FPGA can achieve high densities.

However, the architecture of the FPGA has disadvantages. A volatile process requires a FLASH/EEPROM to be added to the design. The segmented routing architecture limits performance and makes timing unpredictable. Implementing a dual port or FIFO memory with LUTs is slow and inefficient. A complex "design-in-process" is required because the conventional FPGAs do not have predictable timing, short compile times, in-system-reprogrammability (e.g., ISR®, a registered Trademark of Cypress Semiconductor Corp.) or pin fixing. The core voltage of the conventional FPGA is (i) not flexible and (ii) driven by the current process. The conventional FPGA makes product migration very difficult and does not support full JTAG boundary scan and configuration.

SUMMARY OF THE INVENTION

The present invention concerns a programmable logic device comprising one or more horizontal routing channels, one or more vertical routing channels, and one or more logic elements. Each of the logic elements may be configured to connect between one of the horizontal routing channels and one of the vertical routing channels. The logic elements may comprise a logic block array and a memory block.

The objects, features and advantages of the present invention include providing a programmable logic device architecture that may (i) implement advanced process technology without an EEPROM and/or high voltage; (ii) have a separate off chip non-volatile storage device within the same package; (iii) reduce power consumption; (iv) provide configurable single port RAMS, dual port RAMs and/or FIFOs; (v) provide configurable I/O cells; (vi) bank I/O cells to support multiple I/O standards within the same product; (vii) use a hierarchical PIM based routing structure for a high-speed, compact routing structure; (viii) have a simple timing model; (ix) provide a dual port memory with dedicated logic and arbitration or a FIFO memory with dedicated logic and flags, that may improve memory performance and increase the capacity of the device; (x) have a routing structure that may not require a place and/or route step; (xi) provide a STAPL interface to allow for a part to be reconfigured in-system; (xii) provide an on-chip voltage regulator for a flexible core voltage; and/or (xiii) support a JTAG boundary scan (including INTEST) for easy debugging.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
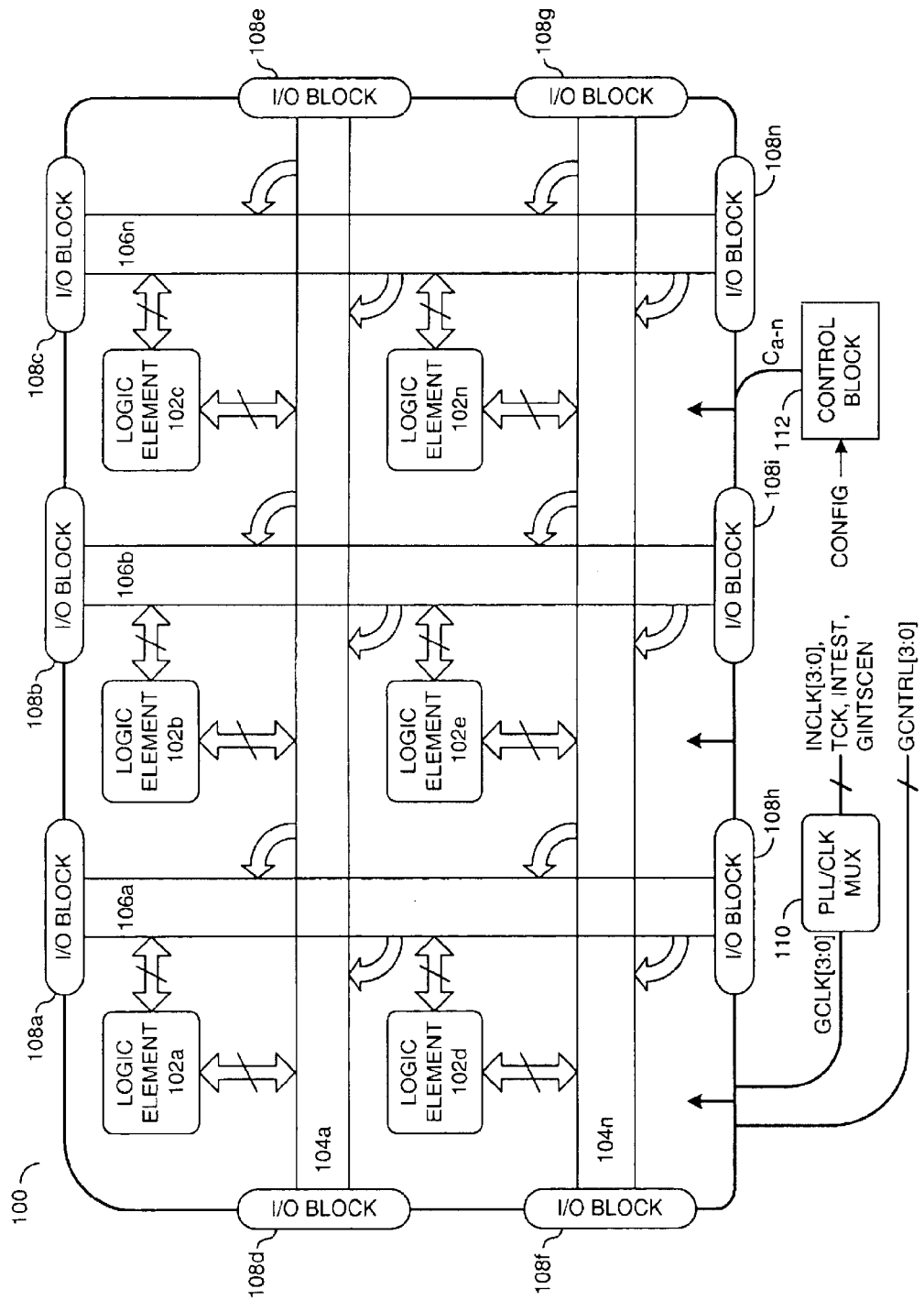
FIG. 1 is a block diagram of a preferred embodiment of the present invention.

Referring to FIG. 1, a block diagram of a programmable logic device (PLD) 100 is shown in accordance with a preferred embodiment of the present invention. The PLD 100 may be implemented using an advanced CMOS logic process. The PLD 100 may be implemented as a volatile or non-volatile device. When a non-volatile device is desired, the PLD 100 may be implemented with a separate non-volatile storage device within the same package. The PLD 100 may support, in one example, an external core voltage of 3.3V, 2.5V, or 1.8V through the use of an internal voltage regulator. The range of core voltages may provide for the migration of previous applications to the PLD 100 without requiring a change in a power supply scheme.

The PLD 100 may comprise, in one example, a number of logic elements 102a–102n, a number of horizontal routing channels 104a–104n, a number of vertical routing channels 106a–106n, a number of I/O blocks 108a–108n, a PLL/CLK multiplexer circuit 110, and a control circuit 112. The logic elements 102a–102n may be placed in a two dimensional array (e.g., 2×3, 3×3, 3×4, 4×4, 4×5, 5×5, 5×6, 6×6, etc.). The array sizes may be adjusted to meet the design criteria of a particular application. Each of the logic elements 102a–102n is generally connected to (i) one of the horizontal routing channels 104a–104n in the x axis and (ii) one of the vertical routing channels 106a–106n in the y axis. The routing channels 104a–104n and 106a–106n generally form a row and column, non-segmented routing matrix. The logic elements 102a–102n may be configured to receive a global clock signal (e.g., GCLK) and a control signal (e.g., $C_{a-n}$). The signal GCLK may comprise one or more clock signals. In one example, the signal GCLK comprises four clock signals (e.g., GCLK[3:0]). The signal $C_{a-n}$ may be n-bits wide, where n is an integer, and used to control the configuration of the PLD 100. Each bit of the signal $C_{a-n}$ may use fewer than n bits.

Each of the I/O blocks 108a–108n may be connected to an end of the routing channels 104a–104n and 106a–106n. The I/O blocks 108a–108n may have (i) an input that may receive a global control signal (e.g., GCNTRL), and (ii) an input the may receive the signal GCLK[3:0]. The global control signal GCNTRL may comprise one or more control signals. In one example, the signal GCNTRL may comprise four control signals (e.g., GCNTRL[3:0]). The separate I/O blocks 108a–108n may provide for improved design "fitting", pinout flexibility, and I/O performance. The I/O blocks 108a–108n may be combined to form I/O banks that may be configured to support all of the current I/O standards within the 1.5V to 3.3V range.

The PLD 100 may have, in one example, four dedicated inputs configured to receive the four global I/O control signals GCNTRL[3:0], four dedicated clock inputs configured to receive four input clock signals (e.g., INCLK[3:0]), an input configured to receive a test clock signal (e.g., TCK), an input configured to receive a command signal (e.g., INTEST), and an input configured to receive an enable signal (e.g., GINTSCEN). However, other numbers of dedicated pins may be implemented accordingly to meet the design criteria of a particular application. The signals GCNTRL[3:0] are generally presented to control inputs of the I/O blocks 108a–108n. The signals GCNTRL[3:0] may be used, in one example, for fast I/O control (e.g., reset, output enable and/or clock enable).

The signals INCLK[3:0], TCK, INTEST, and GINTSCEN are generally presented to the PLL block 110. The PLL block 110 may be configured to generate the four global clock signals GCLK[3:0] in response to the signals INCLK[3:0] and $C_{a-n}$. The global clock signals GCLK[3:0] may be presented to a clock input of every register in the PLD 100. The PLL block 110 may be configured to present any or all of the signals GCLK[3:0] as a multiplied, divided, phase shifted, or de-skewed version of the signal INCLK[0].

The control block 112 may configure the PLD 100 to provide (i) support for a JTAG boundary scan, the JTAG programming standard STAPL, JTAG INTEST, and/or full scan and (ii) support for several configurations that may use compression/de-compression to reduce storage requirements and error checking to detect problems. The configurations may include a master serial, a master parallel, and/or a JTAG interface. The control block 112 may be configured to generate the control signal $C_{a-n}$ in response to an external configuration signal (e.g., CONFIG). The signal Can be used to configure signal pathways and components within the PLD 100.

Figure 2:
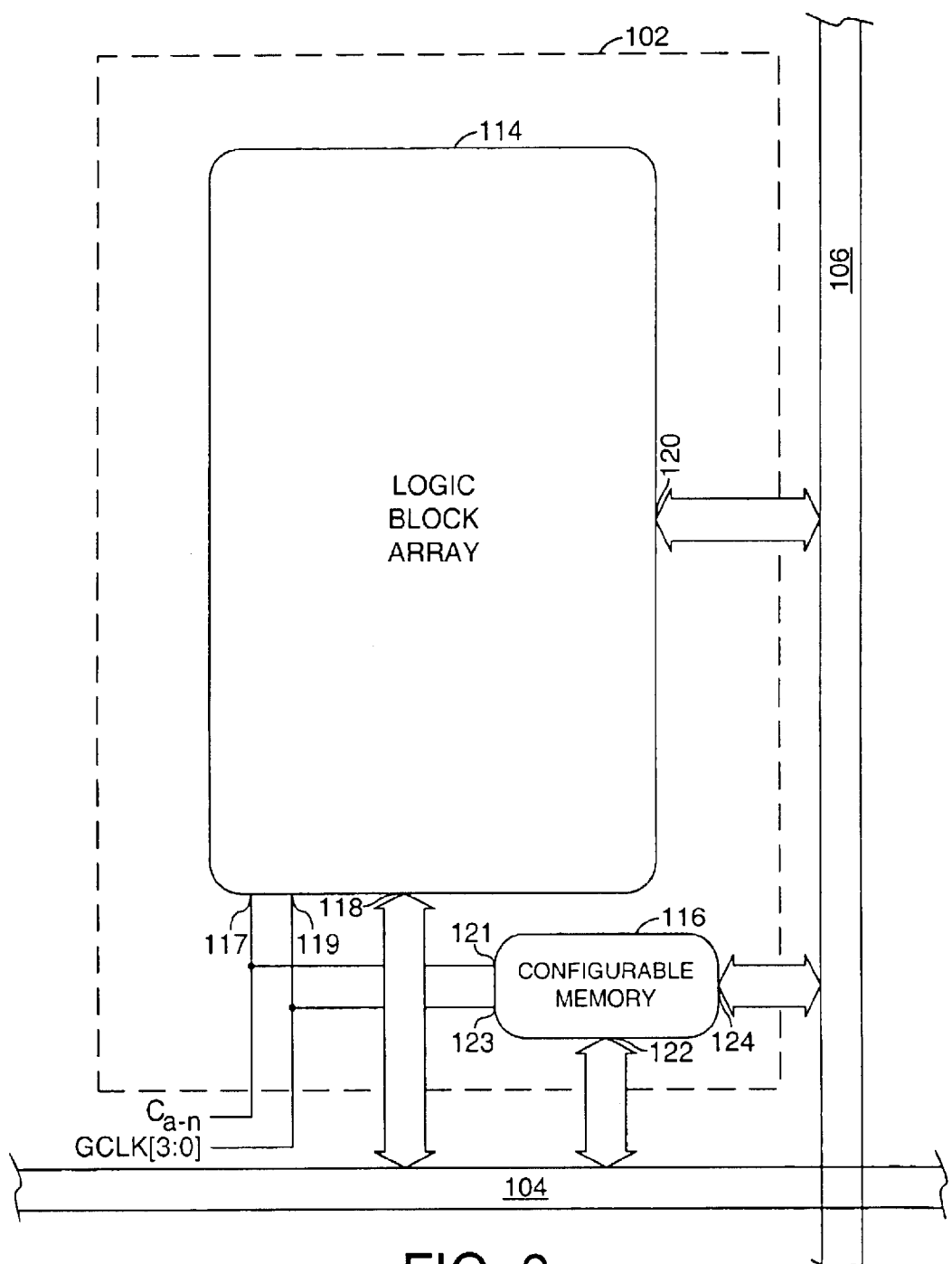
FIG. 2 is a block diagram of a logic element of FIG. 1.

Referring to FIG. 2, a block diagram of the logic element 102 is shown. The logic element 102 may comprise, in one example, a logic block array 114 and a configurable memory 116. The logic block array 114 may have (i) an input 117 that may receive the signal $C_{a-n}$, (ii) an input/output 118 that may receive/present signals from/to the horizontal routing channel 104, (iii) an input 119 that may receive the signal GCLK[3:0], and (iv) an input/output 120 that may receive/present signals from/to the vertical routing channel 106. The configurable memory 116 may have (i) an input 121 that may receive the signal $C_{a-n}$, (ii) an input/output 122 that may receive/present signals from/to the horizontal routing channel 104, (iii) an input 123 that may receive the signal GCLK[3:0] and (iv) an input/output 124 that may receive/present signals from/to the vertical routing channel 106. The configurable memory 116 may be configured, in one example, as (i) an asynchronous dual port memory, (ii) a synchronous dual port memory, or (iii) a synchronous FIFO memory. The memory 116 may be configured as ×1, ×2, ×4, or ×8 wide memory. The memory 116 may be placed in the routing channels to achieve high performance with the I/O blocks 108.

Figure 3:
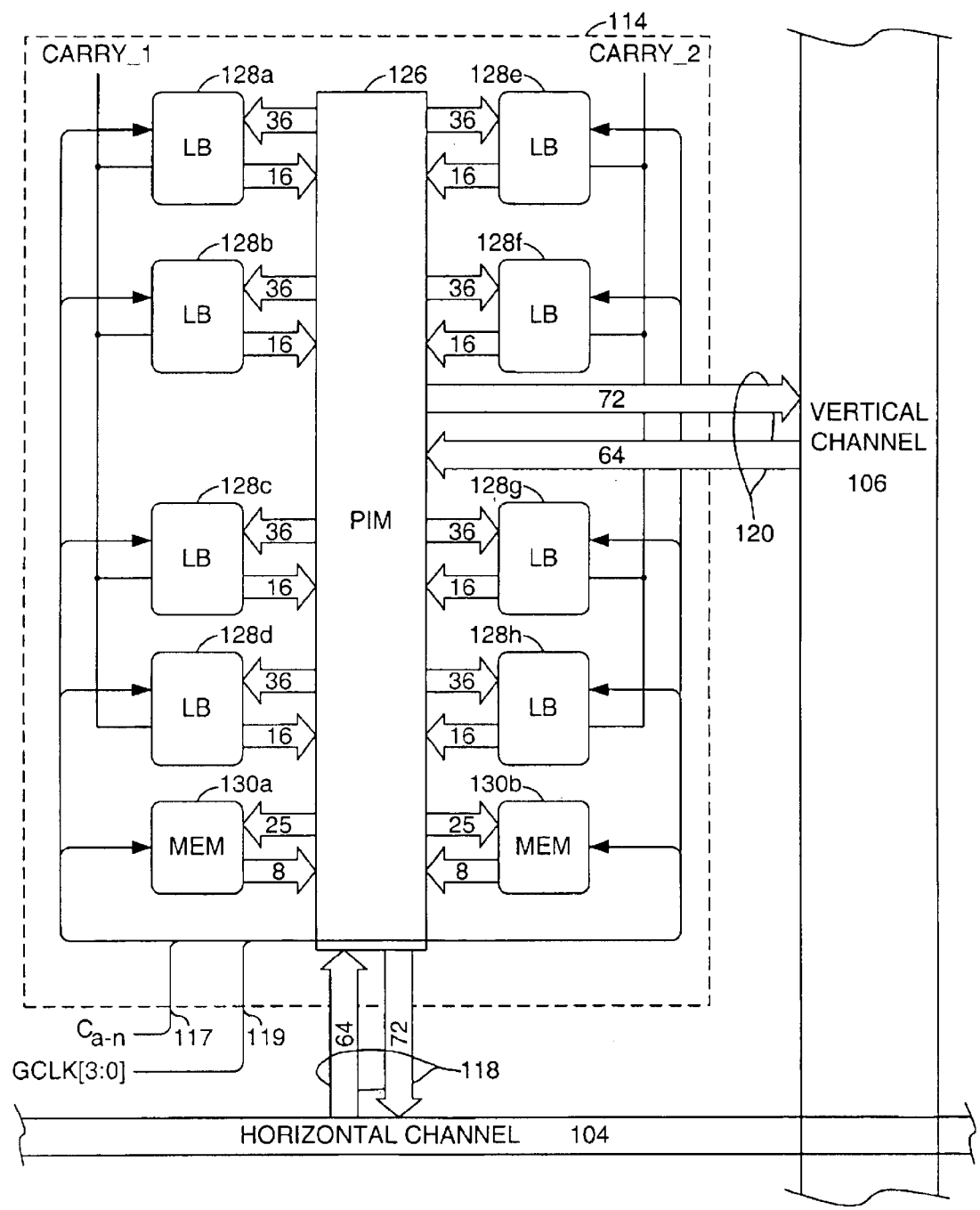
FIG. 3 is a detailed block diagram of a logic block array iv of FIG. 2.

Referring to FIG. 3, a more detailed block diagram of the logic block array 114 is shown. The logic block array 114 may comprise, in one example, a programmable interconnect matrix (PIM) 126, eight logic blocks 128a–128h, and two memory blocks 130a and 130b. However, other numbers of logic blocks 128 and memory blocks as 130 may be implemented accordingly to meet the design criteria of a particular application. The PIM 126 is generally connected via the input/output 118 to the horizontal channel 104 and via the input/output 120 to the vertical channel 106. The input/outputs 118 and 120 may comprise, in one example, 64 inputs and 72 outputs each. The greater number of outputs is generally used for the outputs of the memories 130a and 130b. The PIM 126 may have 36 outputs that may present signals to the logic block 128a and 16 inputs that may receive signals from the logic block 128a. The PIM 126 may have similar connections to the logic blocks 128b–128h. The PIM may have 25 outputs that may present signals to the memory 130a and 8 inputs that may receive signals from the memory 130a. The PIM 126 may be similarly connected to the memory 130b. Since all the signals traverse the same path, the PIM 126 is generally fast and provides simple timing. The PIM 126 may provide redundant paths for pin-locking flexibility and maximum capacity.

The signals GCLK[3:0] and $C_{a-n}$ are generally presented to an input of the logic blocks 128a–128h and the memories 130a and 130b. The logic blocks 128a–128d may be connected by a carry signal (e.g., CARRY1) to form a carry chain. The logic blocks 128e–128h may be similarly linked by a carry signal (e.g., CARRY2). Up to four logic blocks may be cascaded in a carry chain. The carry chain may start or stop at any macrocell within the carry chain. The carry chains may implement efficiently adders, comparators, and parity generators.

The two memory blocks 130a and 130b may be implemented, in one example, as highly configurable RAM. The memory blocks 130a and 130b may be placed inside the logic block array 114 to achieve a high performance with the local logic blocks. The memory blocks 130a and 130b may be configured as asynchronous, synchronous input, synchronous output, pipelined, ×1, ×2, ×4, ×8, look up tables, and/or ROM code. In one example, the memory blocks 130a and 130b may be implemented as 8K-bit memories for a total of 16K-bits of memory.

Figure 4:
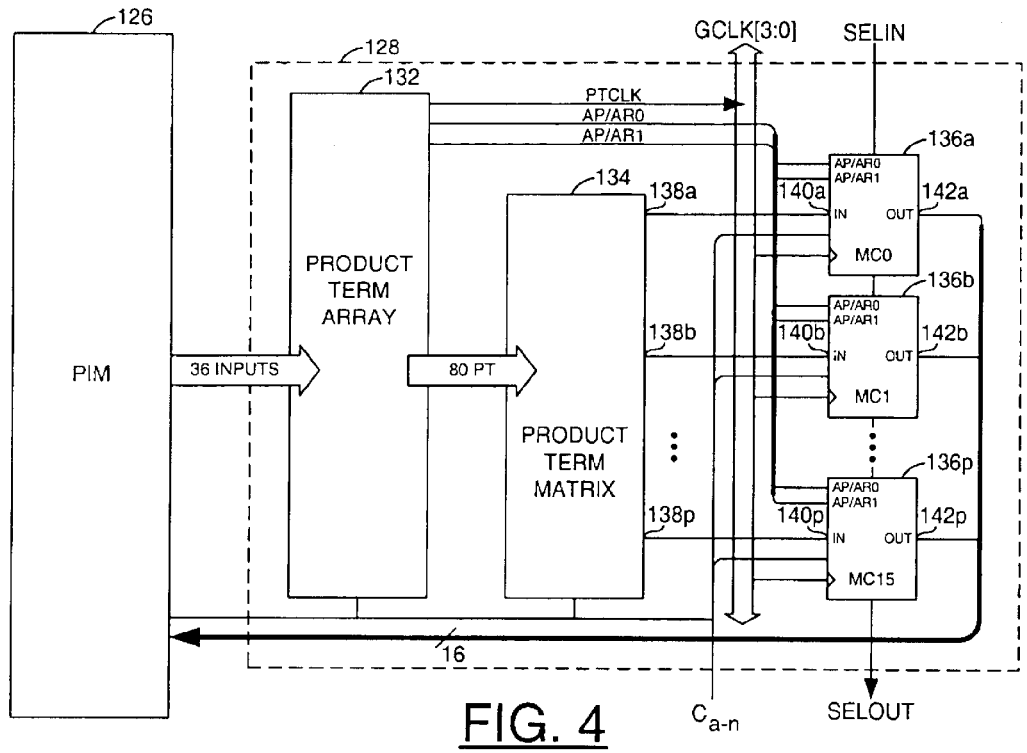
FIG. 4 is a detailed block diagram of a logic block of FIG. 3.

Referring to FIG. 4, a more detailed block diagram of a logic block 128 is shown. The logic block 128 may comprise, in one example, a product term array 132, a product term matrix 134, and sixteen macrocells 136a–136p. To reduce power consumption, the AND plane and OR plane of the logic block 128 generally use complex CMOS logic gates instead of the conventional high power sense amps. The product term array 132 may be configured, in one example, to receive thirty-six input signals from the PIM 126. The product term array 132 may be configured, in one example, to generate (i) eighty product terms that may be presented to the product term matrix 134, (ii) a product term clock signal (e.g., PTCLK) that may be presented to each of the macrocells 136a–136p, and (iii) two product term signals (e.g., AP/AR0 and AP/AR1) that may be presented to the macrocells 136a–136p in response to the thirty-six input signals. The signals AP/AR0 and AP/AR1 may be used as reset or preset signals to any of the macrocells 136a–136p.

The product term matrix 134 may have, in one example, sixteen outputs 138a–138p that may present a signal to each of the sixteen macrocells 136a–136p in response to one or more of the eighty input signals. Each of the outputs 138a–138p may be connected to an input 140a–140p, respectively, of the macrocells 136a–136p. The signals GCLK[3:0] and $C_{a-n}$ are generally presented to the macrocells 136a–136p. Each macrocell 136a–136p may have an output 142a–142p that may present an output signal to an input of the PIM 126. A select signal (e.g., SELIN) may be presented to the macrocells 136a–136p. The macrocells 136a–136p may generate a select signal (e.g., SELOUT) that may be presented at an output of the logic cell 128.

Figure 5:
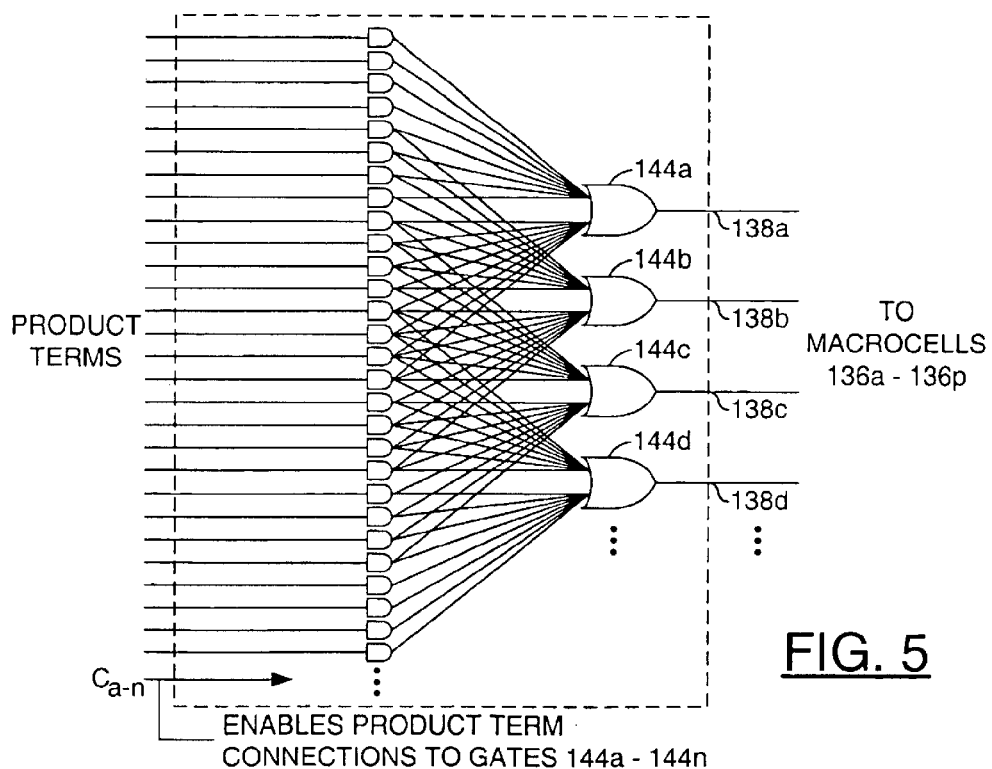
FIG. 5 is a schematic diagram of a product term allocation block of FIG. 4.

Referring to FIG. 5, a partial circuit diagram of the product term matrix 134 of FIG. 4 is shown. The product term matrix 134 may comprise, in one example, sixteen OR gates 144a–144p. The OR gates 144a–144p may be configured to logically combine up to sixteen product terms. However, other types of gates with other numbers of inputs may be implemented accordingly to meet the design criteria of a particular application. The product term matrix 134 may provide for product term sharing and steering that may be important for partitioning and/or fitting algorithms.

Figure 6:
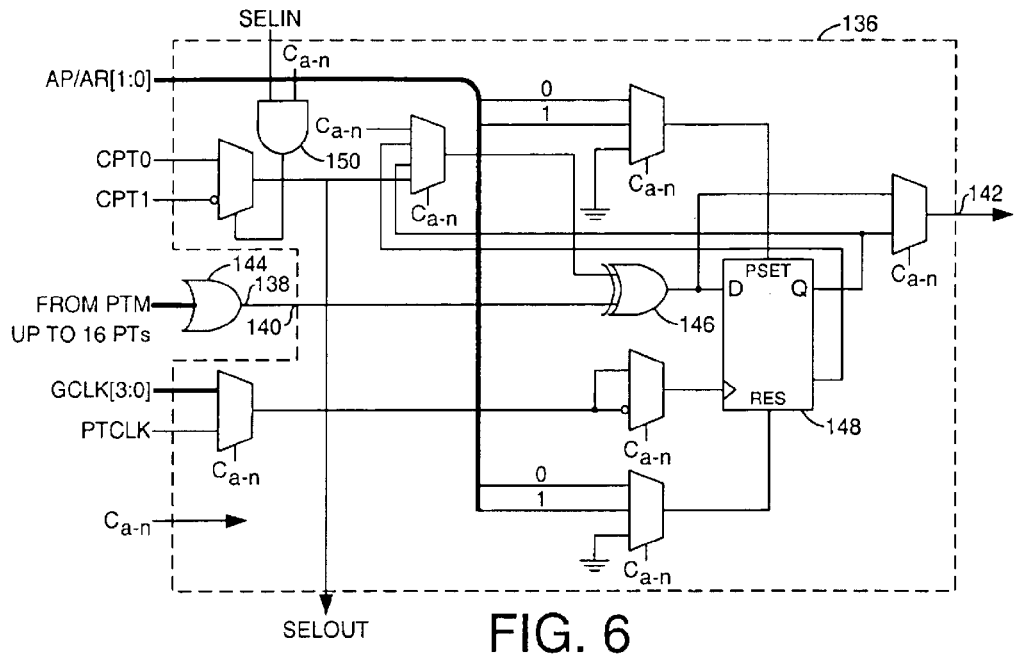
FIG. 6 is a schematic diagram of a macrocell circuit of FIG. 4.

Referring to FIG. 6, a circuit diagram of a macrocell 136 is shown. The macrocell 136 may comprise, in one example, a gate 146, a register 148, and a gate 150. The gate 146 may be implemented, in one example, as an XOR gate. The gate 150 may be implemented, in one example, as an AND gate. However, the gates 146 and 150 may be implemented as other gates to meet the design criteria of a particular application. The gate 144 may present a signal to a first input of the gate 146 in response to up to sixteen product term signals. A signal selected from a first carry (9' product term (e.g., CPT0), a second carry product term (e.g., CPT1), a portion of the control signal $C_{a-n}$, a signal presented at a Q output of the register 148, and a signal presented at a Qb output of the register 148 may be presented to a second input of the gate 146. The signal CPT0 or the signal CPT1 may be selected in response to a select signal (e.g., SELIN) and the signal $C_{a-n}$. The selected signal (e.g., either CPT0 or CPT1) may be used as a select signal (e.g., SELOUT). The gate 146 may have an output that may present a signal to an input of the register 148. The macrocell 136 may present the signal at the input of the register 148 or the signal presented at the Q output of the register 148 as an output signal. The register 148 may be (i) clocked by the product term clock PTCLK, one of the four global clocks GCLK[3:0], or a digital complement thereof, (ii) reset by one of the product terms AP/AR[1:0], and (iii) preset by one of the product terms AP/AR[1:0]. Equations may be inverted before the register 148. The macrocell 136 may be used to create T and /T equations. A carry chain made up of macrocells may allow implementation of adders, comparators, and parity generators.

Figure 7:
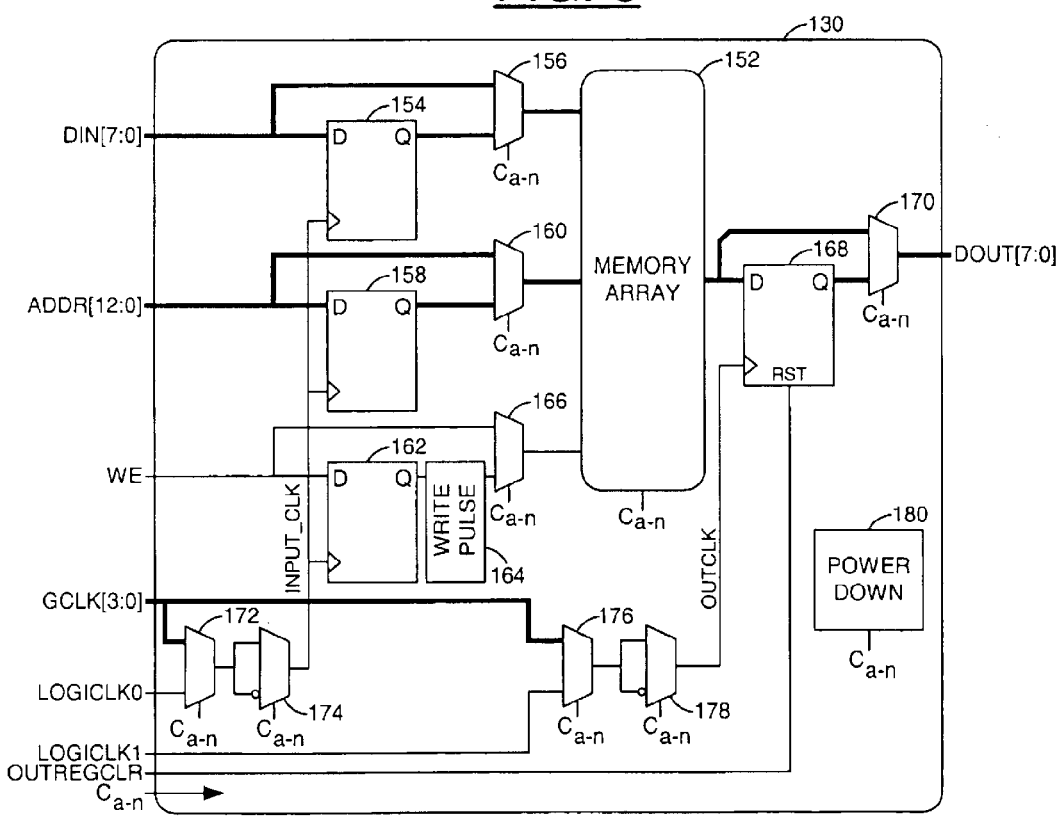
FIG. 7 is a detailed block diagram of a configurable memory block of FIG. 3.

Referring to FIG. 7, a circuit diagram illustrating the memory 130 of FIG. 3 is shown. The memory 130 may have a data 12 input that may receive a data signal (e.g., DIN), an address input that may receive an address signal (e.g., ADDR), an enable input that may receive an enable signal (e.g., WE), a clock input that may receive the signal GCLK[3:0], a clock input that may receive a first local clock signal (e.g., LOGICLK0), a clock input that may receive a second local clock signal (e.g., LOGICLK1), a control input that may receive a reset signal (e.g., OUTREGCLR), a configuration input that may receive the signal $C_{a-n}$, and a data output that may present a data signal (e.g., DOUT). The signals DIN and DOUT may be, in one example, 8 bits wide. The signal ADDR may be, in one example, 13 bits wide.

The memory 130 generally comprises a memory array 152, a register 154, a multiplexer 156, a register 158, a multiplexer 160, a register 162, a write pulse generator 164, a multiplexer 166, a register 168, a multiplexer 170, a multiplexer 172, a multiplexer 174, a multiplexer 176, a multiplexer 178, and a power down circuit 180. The signal DIN is generally presented to an input of the register 154 and a first input of the multiplexer 156. The ft register 154 may have a clock input that may receive a clock signal (e.g., INPUT_CLK) and an output that may be connected to a second input of the multiplexer 156. The multiplexer 156 generally selects 3 either (i) the signal DIN or (ii) the output of the register 154 as a data input signal to the memory array 152 in response to the signal $C_{a-n}$.

The signal ADDR is generally presented to an input of the register 158 and a first input of the multiplexer 160. The register 158 may have a clock input that may receive the clock signal INPUT_CLK and an output that may be connected to a second input of the multiplexer 160. The multiplexer 160 generally selects either (i) the signal ADDR or (ii) the output of the register 158 as an address input signal to the memory array 152 in response to the signal $C_{a-n}$.

The signal WE is generally presented to an input of the register 162 and a first input of the multiplexer 166. The register 162 may have a clock input that may receive the clock signal INPUT_CLK and an output that may be connected to an input of the write pointer 164. An output of the write pulse generator 164 is generally connected to a second input of the multiplexer 166. The multiplexer 166 generally selects either (i) the signal WE or (ii) the output of the write pulse generator 164 as an enable input signal to the memory array 152 in response to the signal Can.

The memory array 152 generally has an output that generally presents a data signal to an input of the register 168 and a first input of the multiplexer 170. The register 168 may have a clock input that may receive a clock signal (e.g., OUTCLK) and an output that may be connected to a second input of the multiplexer 170. The multiplexer 170 generally selects either (i) the data signal from the memory array 152 or (ii) the output of the register 168 as the signal DOUT in response to the signal $C_{a\text{-}n}$.

The multiplexers 172 and 174 may be configured to select one of the global clock signals GCLK[3:0], the local clock signal LOGICLK0, or a complement thereof as the signal INPUT_CLK in response to the signal C. The multiplexers 176 and 178 may be configured to select one of the global clock signals GCLK[3:0], the local clock signal LOGICLK1, or a complement thereof as the signal OUTCLK in response to the signal $C^{a\text{-}n}$.

The power down circuit 180 may power down the memory 130 in response to the signal $C_{a\text{-}n}$.

The memory 130 may be configured, in one example, as asynchronous, synchronous inputs, synchronous outputs, pipelined, ×1, ×2, ×4, ×8, look up tables, and/or ROM code. The output of the memory 130 may be registered during asynchronous operation. The 19 memory 130 may be, in one example, (i) implemented as an 8K-bit memory and (ii) configured to have a block size of 8K×1, 4K×2, 2K×4, or 1K×8. Two or more memories 130 may be cascaded to provide wider and/or deeper memory blocks. The memories 130 of different logic block arrays 114 may be cascaded. During synchronous operation, the inputs and output of the cluster memory 130 may be independently clocked.

Figure 8:
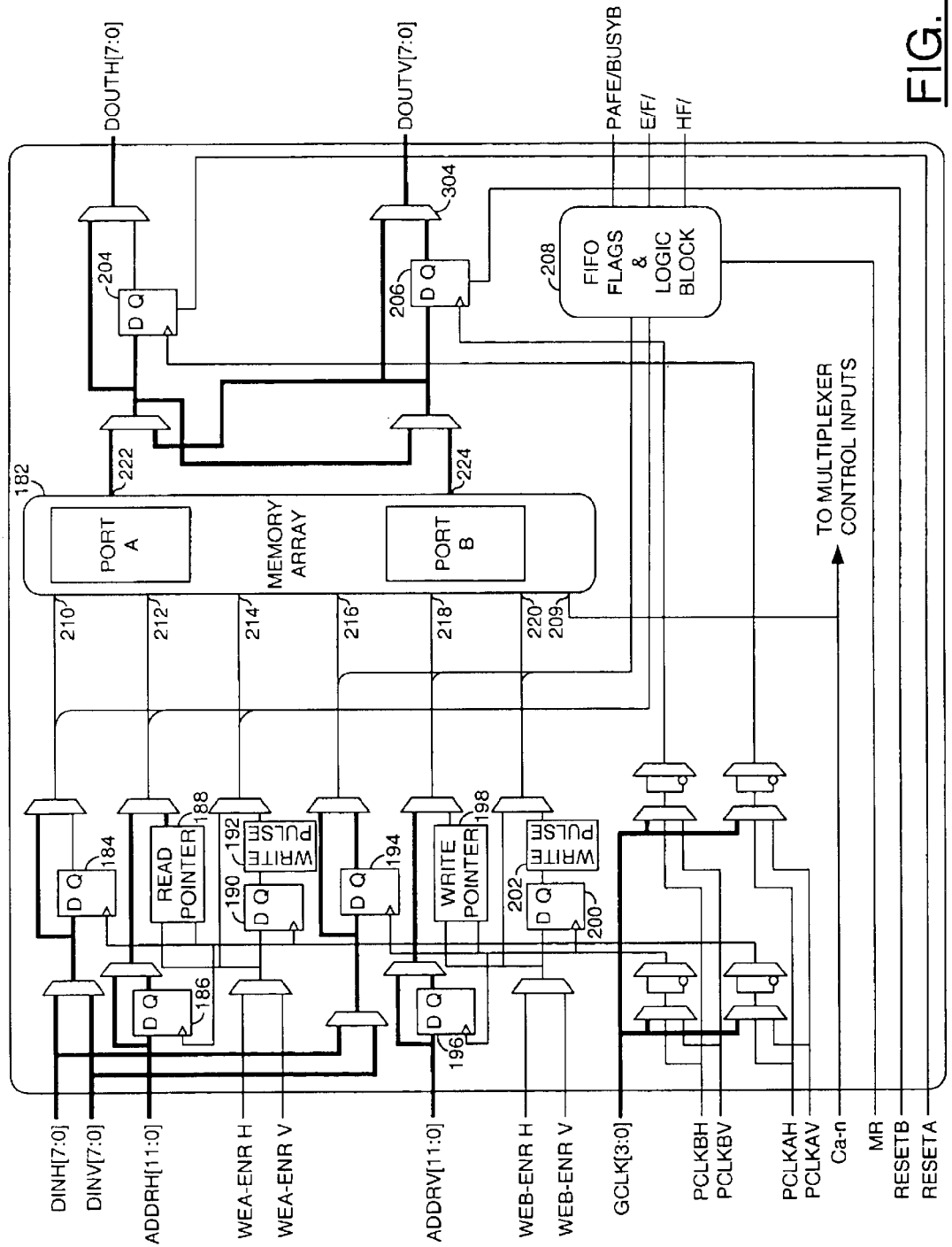
FIG. 8 is a detailed block diagram of a configurable memory block of FIG. 2.

Referring to FIG. 8, a detailed block diagram of the configurable memory 116 is shown. The configurable memory 116 may be implemented similarly to a circuit 100 that may be found in the co-pending application Ser. No. 09/445,808, filed concurrently, which is hereby incorporated in its entirety. The memory 116 may comprise a memory array 182, a register 184, a register 186, a read pointer 188, a register 190, a write pulse generator 192, a register 194, a register 196, a write pointer 198, a register 200, a write pulse generator 202, a register 204, a register 206, and a dedicated FIFO flags and logic block 208. The memory array 182 may be implemented, in one example, as an asynchronous dual port memory array. The memory array 182 may have a configuration input 209 that may receive the signal $C_{a\text{-}n}$, a first a port (e.g., A) and a second port (e.g., B). The port A may have a data input 210 that may receive (i) a data signal (e.g., DINH) from the horizontal routing channel 104 or (ii) a data signal (e.g., DINV) from the vertical routing channel 106. The signal DINH or the signal DINV may be presented directly to the input 210 or through the register 184. The port A may have an address input 212 that may receive (i) an address signal (e.g., ADDRH) from the horizontal routing channel 104 or (ii) an address signal from the read pointer 188. The signal ADDRH may be presented directly to the input 210 or through the register 190. The port A may have an enable input 214 that may receive (i) an enable signal (e.g., WEA-ENR_H) from the horizontal routing channel 104 or (ii) an enable signal (e.g., WEA-ENR_V) from the vertical routing channel 106. The signal WEA-ENR_H or the signal WEA-ENR_V may be presented directly to the input 214 or through the register 192 and the write pulse generator 194. The registers 184, 186, and 190 may have a clock input that may receive (i) one of the global clock signals GCLK[3:0], a logic clock signal (e.g., PCLKAH) from the horizontal routing channel 104, or a logic clock signal (e.g., PCLKAV) from the vertical routing channel 106. The polarity of the clock signal received may be selected.

The port B may have a data input 216 that may receive (i) im the data signal DINH or (ii) the data signal DINV. The signal DINH or the signal DINV may be presented directly to the input 216 or through the register 194. The port A may have an address input 218 that may receive (i) an address signal (e.g., ADDRV) from the vertical routing channel 106 or (ii) an address signal from the write pointer 198. The signal ADDRV may be presented directly to the input 210 or through the register 196. The port A may have an enable input 220 that may receive (i) an enable signal (e.g., WEB-ENR_H) from the horizontal routing channel 104 or (ii) an enable signal (e.g., WEB-ENR_V) from the vertical routing channel 106. The signal WEB-ENR_H or the signal WEB-ENR_V may be presented directly to the input 220 or through the register 200 and the write pulse generator 202. The registers 194, 196, and 200 may have a clock input that may receive (i) one of the global clock signals GCLK[3:0], a logic clock signal (e.g., PCLKBH) from the horizontal routing channel 104, or a logic clock signal (e.g., PCLKBV) from the vertical routing channel 106. The polarity of the clock signal received may be selected.

The port A may have a data output 222 that may present a data signal (i) to the horizontal routing channel 104, directly or through the register 204 and/or (ii) to the vertical routing Li channel 106, directly or through the register 206. The port B may have a data output 224 that may present a data signal (i) to the horizontal routing channel 104, directly or through the register 204 and/or (ii) to the vertical routing channel, directly or through the register 206. The register 204 may have a clock input that may receive (i) one of the global clock signals GCLK[3:0], (ii) the clock signal PCLKAH, or (iii) the clock signal PCLKAV. The polarity of the clock signal received may be selected. The register 206 may have a clock input that may receive (i) one of the global clock signals GCLK[3:0], (ii) the clock signal PCLKBH, or (iii) the clock signal PCLKBV. The polarity of the clock signal received may be selected.

The dedicated logic block 208 may be configured to present port arbitration signals and/or FIFO flag signals to the horizontal routing channel 104 and the vertical routing channel 106.

The memory 116 may change configurations in response to the signal $C_{a\text{-}n}$. The memory 116 may be configured as an asynchronous dual port RAM, a synchronous dual port RAM, a synchronous input RAM, a synchronous output RAM or a FIFO memory. However, other configurations of memory may be implemented to meet the design criteria of a particular application. The memory 116 may also configure a width of data stored in response to the signal $C_{a\text{-}n}$. The memory 116 may have, in one example, a data width of ×1, ×2, ×4 or ×8. However, other widths of data may be implemented to meet the design criteria of a particular application. The memory 116 may be implemented, in one example, as a 4K-bit dual port array. However, other size arrays may be implemented accordingly to meet the design criteria of a particular application. In one example, the memory 116 may be configured as a 4K×1, 2K×2, 1K×4, or 512×8 array. However, other configurations may be implemented accordingly with an array of a different size. Two or more memories 116 may be cascaded using the routing channels 104 and 106 to form larger memory blocks.

Figure 9:
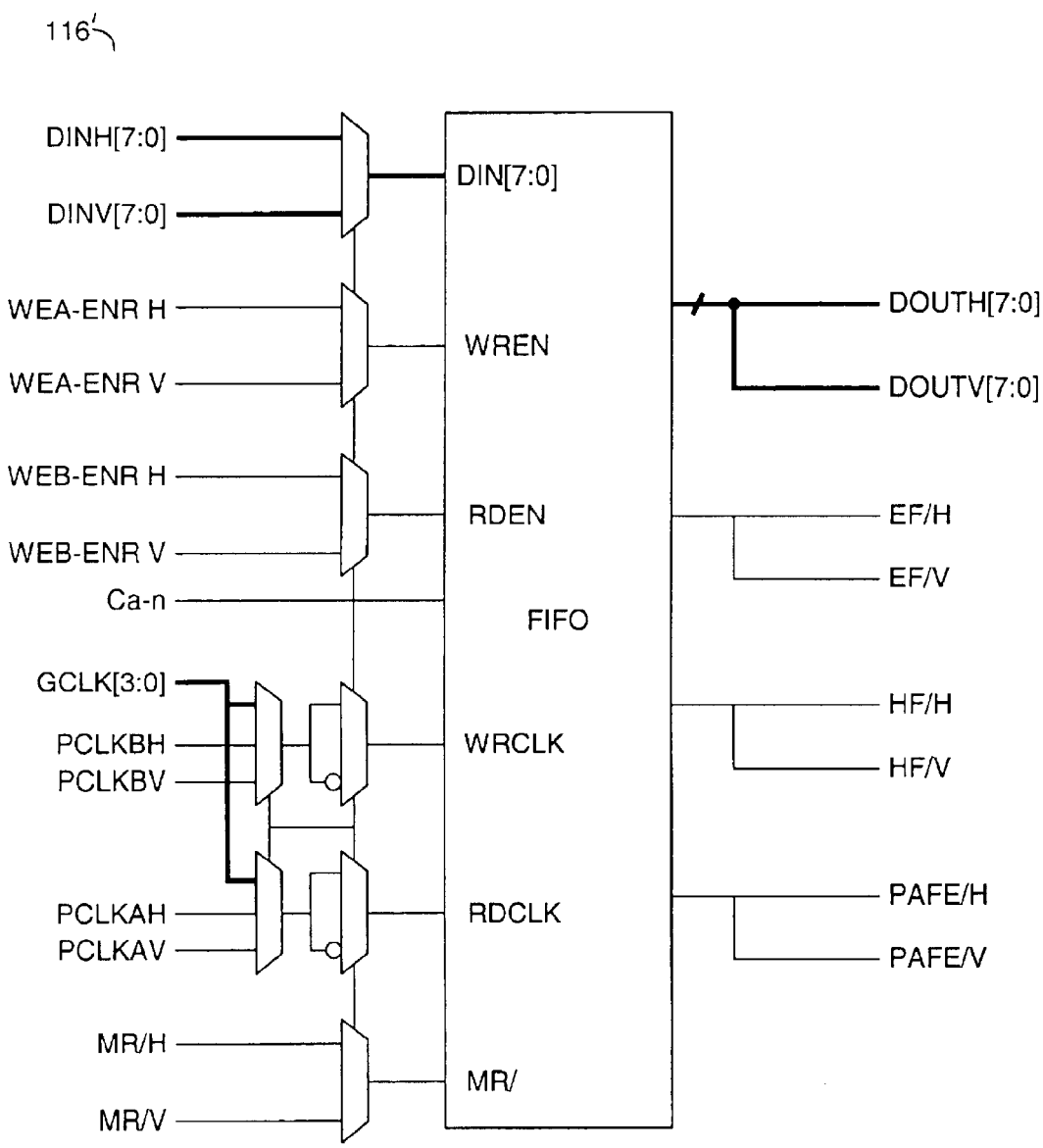
FIG. 9 is a detailed block diagram of a configurable memory of FIG. 8 configured as a FIFO.

Referring to FIG. 9, a diagram of a memory 116 illustrating a FIFO configuration is shown. When used in the FIFO configuration, the width of the FIFO may be expanded using two or more memories 116. However, the depth of the FIFO will generally be limited to the size of a single memory 116. For example, a 4 K-bit memory 116 will generally yield a FIFO with a maximum depth of 4K bits. The FIFO implemented with one or more memories 116 may be configured to receive data signals, a write enable signal and a read enable signal from either the horizontal routing channel 104 or the vertical routing channel 106. The FIFO may have independent read and write clocks. Clock signals for read, write, and synchronous activities may be chosen from the four global clocks GCLK[3:0], the two logic clock signals PCLKA_H and PCLKB_H from the horizontal channel 104, and the two logic clock signals PCLKA_V, and PCLKB_V from the vertical channel 106. The polarity of the clock signals may also be selected. The FIFO configuration of the memory 116 may present data output and flag signals to both the horizontal routing channel 104 and the vertical routing channel 106.

Figure 10:
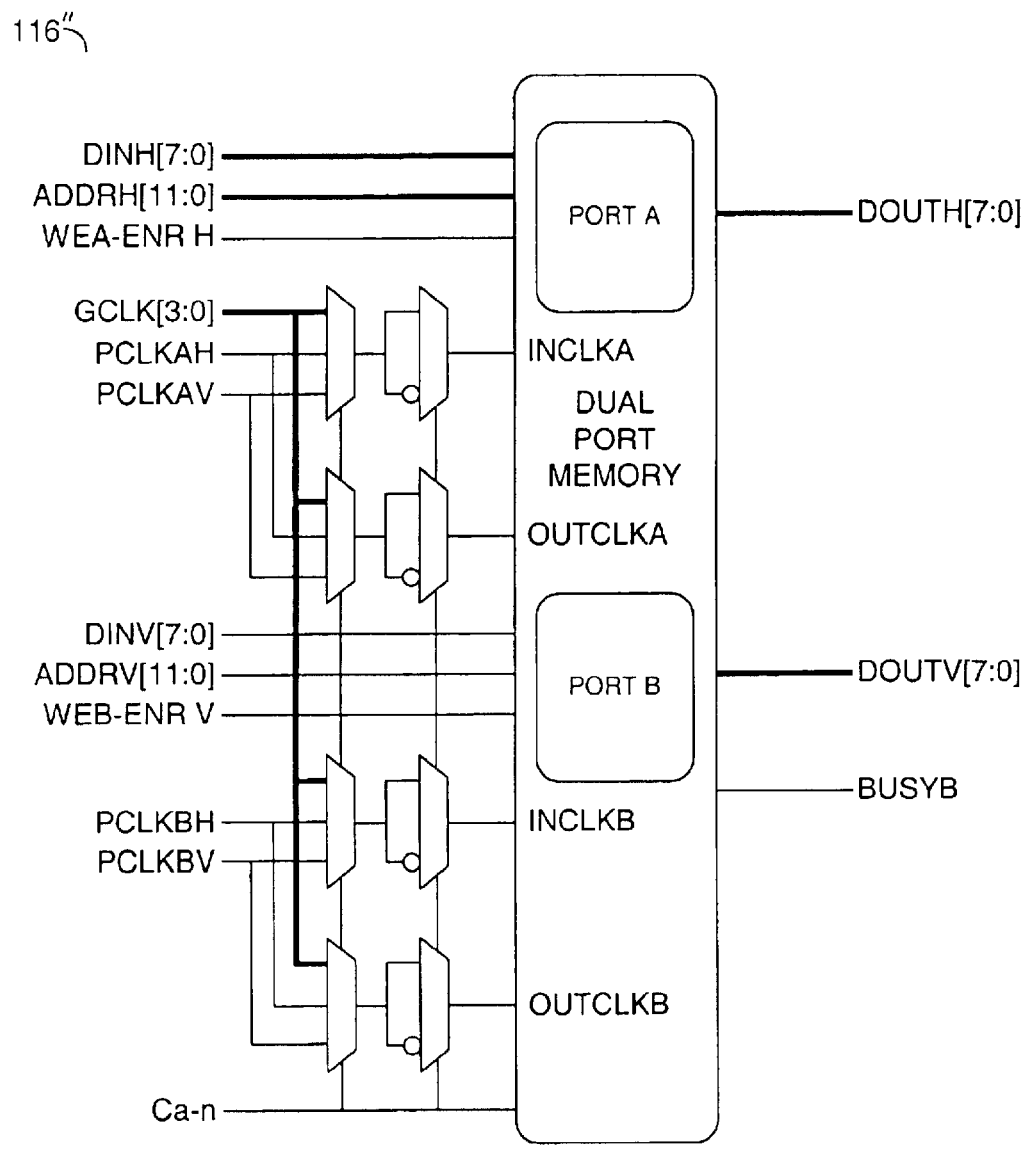
FIG. 10 is a detailed block diagram of a configurable memory of FIG. 8 configured as a dual-port memory.

Referring to FIG. 10, a diagram of a memory 116" illustrating a dual-port configuration is shown. In the dual port configuration, the memory 116 may have a port A and a port B. The port A and the port B may operate in a synchronous or asynchronous mode. However, both ports A and B will generally operate in the same mode. Port A generally receives data signals, address signals, and control signals from the horizontal channel 104 and presents data signals to the horizontal channel 104. Port B generally receives data signals, address signals, and control signals from the vertical channel 106 and generally presents data signals to the vertical channel 106. The ports A and B will generally be arbitrated so that the port A will generally win all conflicts. In the dual port configuration, two or more memories 116 may be cascaded to provide a memory block with a larger width and/or depth. The clock signals for read, write, and synchronous activities may be chosen from the four global clocks GCLK[3:0] or from the four logic clocks PCLKA_H, PCLKB_H, PCLKA_V, and PCLKB_V from the channels 104 and 106. The polarity of the clocks may also be selected.

Figure 11:
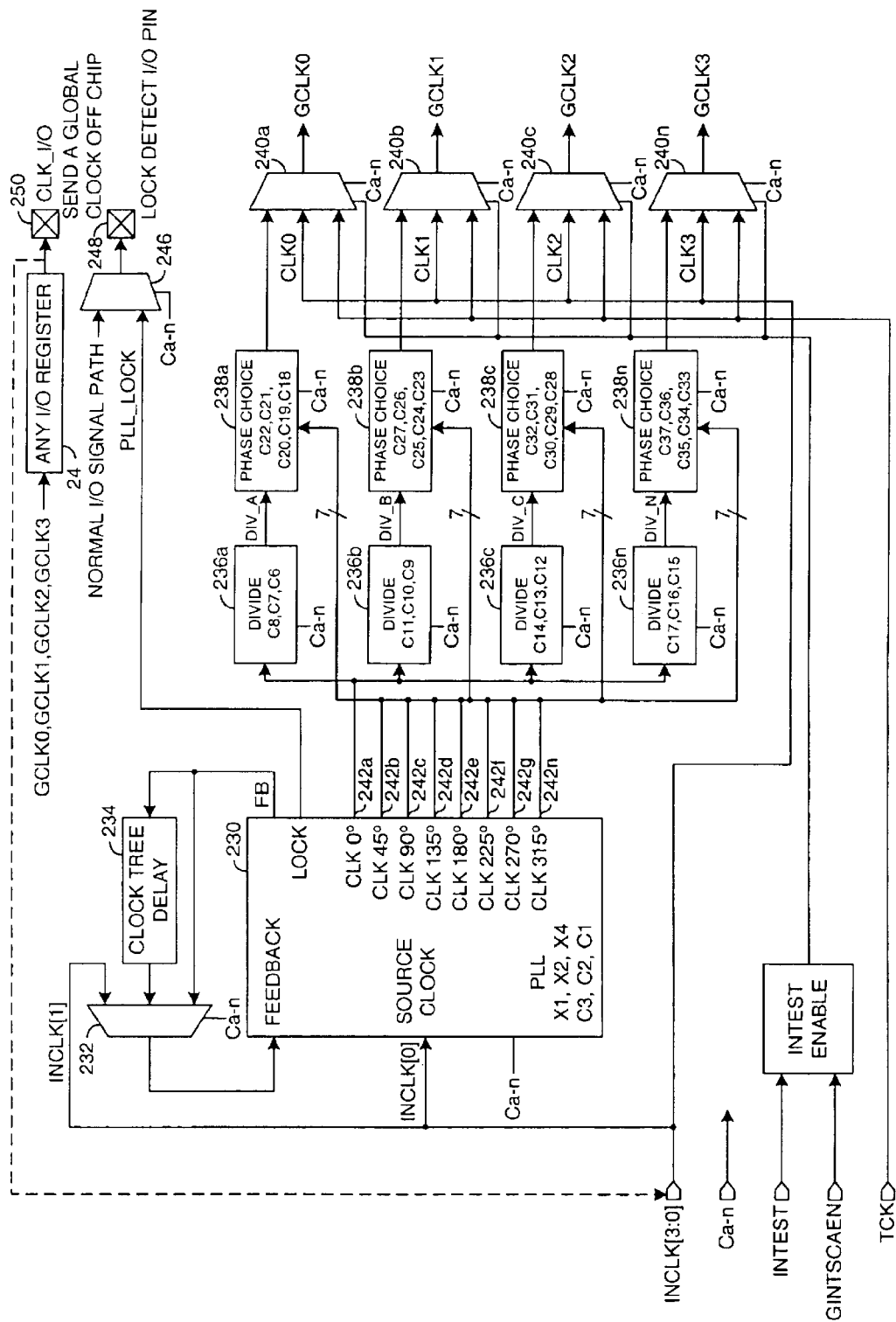
FIG. 11 is a detailed block diagram of a clock PLL circuit of FIG. 1.

Referring to FIG. 11, a block diagram of the PLL/CLK multiplexer circuit 110 is shown. The circuit 110 may comprise a phase lock loop (PLL) 230, a multiplexer 232, a delay circuit 234, a number of dividers 236a–236n, a number of intermediate multiplexers 238a–238n, and a number of output multiplexers 240a–240n. The signal INCLK(0) may be presented to a source clock input of the PLL 230. The PLL 230 may have (i) a number of outputs 242a–242n that may present a number of output signals (e.g., CLK_0, CLK_45, CLK_90, CLK_135, CLK_180, CLK_225, CLK_270, CLK_315, etc.) having different phases in response to the signal INCLK(0) and a feedback signal. The feedback signal may be (i) the signal INCLK(1), (ii) an output signal (e.g., FB) or (iii) a signal generated by the clock delay circuit 234 in response to the signal FB. The PLL 230 may be configured to multiply the frequency of the signal INCLK(0) by a multiplier factor (e.g., 1, 2, 4, etc.) selected in response to the signal Can. The PLL 230 may have an output that may present a status signal (e.g., PLL_LOCK) that may indicate when the PLL is locked.

The signal CLK_0 may be presented to the dividers 236a–236n. The dividers 236a–236n may be configured to generate a signal (e.g., DIV_A-DIV_N) that may be presented to an input of the multiplexers 238a–238n, respectively, by dividing the signal CLK_0 by a division factor (e.g., 1, 2, 3, 4, 5, 6, 8, 16, etc.). The division factor may be selected in response to the signal Ca. The signal INCLK(1) may be used as a board de-skew reference. When the signal INCLK(1) is used as a de-skew reference, one of the global clocks GCLK[3:0] may be presented from a macrocell 244 to the INCLK(1) input. The signals CLK_45, CLK_90, CLK_135, CLK_180, CLK_225, CLK_270, and CLK_315 may be presented to an input of the intermediate multiplexers 238a–238n.

The multiplexers 238a and 240a may select, in one example, one of the signals DIV_A, CLK_45, CLK_90, CLK_135, 1 CLK_180, CLK_225, CLK_270, CLK_315, TCK, and INCLK(0) as the signal GCLK(0) in response to the signals Ca-n, INTEST, and GINTSCEN. The multiplexers 238b and 240b may select, in one example, one of the signals DIV_B, CLK_45, CLK_90, CLK_135, CLK_180, CLK_225, CLK_270, CLK_315, TCK, and INCLK(1) as the signal GCLK(1) in response to the signal $C_{a-n}$, INTEST, and GINTSCEN. The multiplexers 238c and 240c may select, in one example, one of the signals DIV_C, CLK_45, CLK_90, CLK_135, CLK_180, CLK_225, CLK_270, CLK_315, TCK, and INCLK(2) as the signal GCLK(2) in response to the signal Can, INTEST, and GINTSCEN. The multiplexers 238n and 240n may select, in one example, one of the signals DIV_N, CLK_45, CLK_90, CLK_135, CLK_180, CLK_225, CLK_270, CLK_315, TCK, and INCLK(3) as the signal GCLK(3) in response to the signal $C_{a-n}$, INTEST, and GINTSCEN.

The circuit 110 may have a multiplexer 246 that may select a status signal (e.g., PLL_LOCK) or a normal I/O signal for presentation to a bonding pad 248 in response to the signal Ca-n. The macrocell 244 may be configured to select the signal GCLK(0), the signal GCLK(1), the signal GCLK(2), or the signal GCLK(3) as an output clock signal (e.g., CLK-I/0) at a bonding pad 250.

Figure 12:
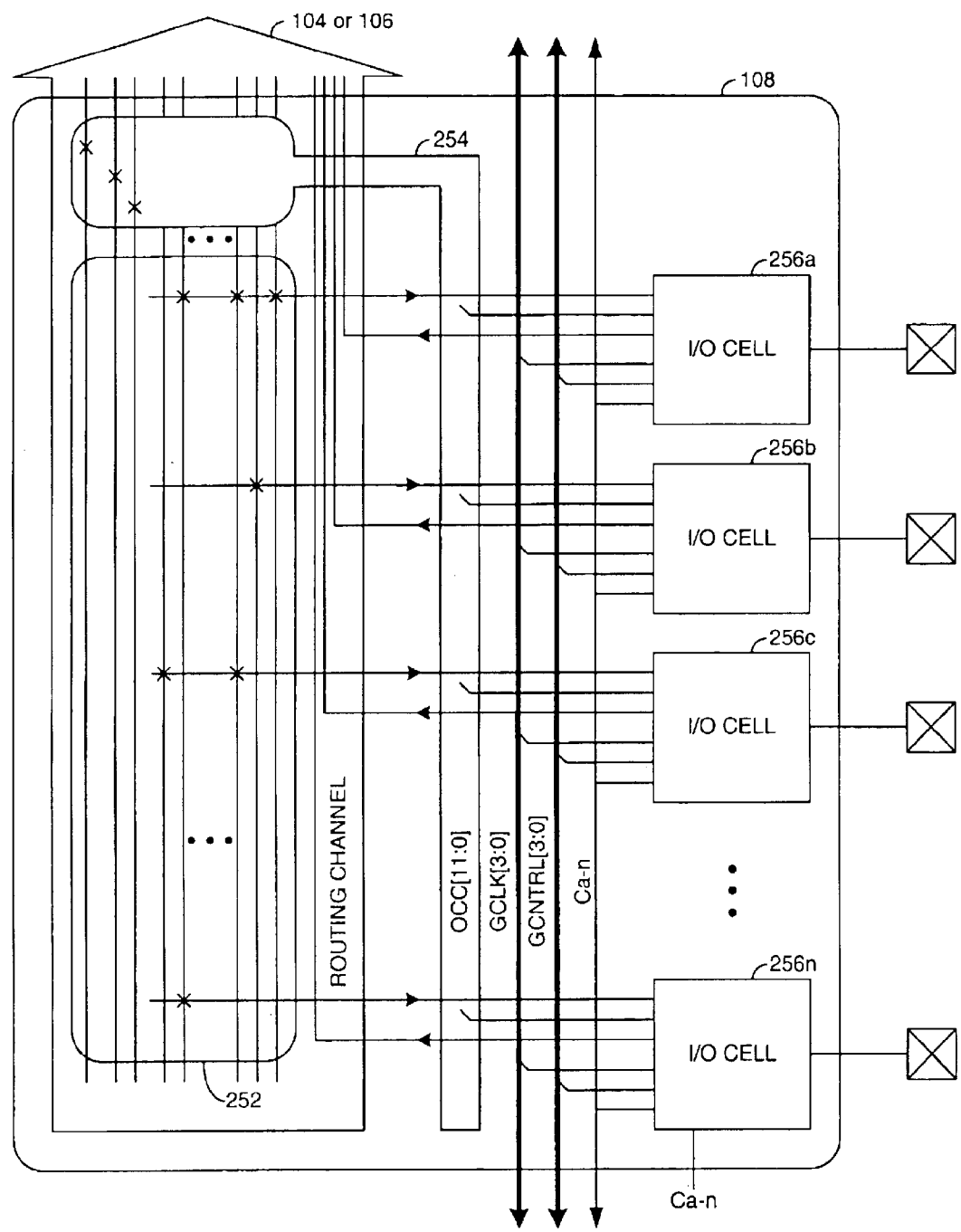
FIG. 12 is a detailed block diagram of an I/O block of FIG. 1.

Referring to FIG. 12, a block diagram of the I/O block 108 of FIG. 1 is shown. The I/O block 108 generally comprises an output PIM 252, an output control channel 254 and a number of I/O cells 256a–256n. In one example, the I/O block 108 may comprise 21 I/O cells. The output PIM 252 may connect the I/O cells 256a–256n to the routing channels. The I/O cells 256a–256n may have (i) an input that may receive the signal Can, (ii) an input that may receive the global I/O control signal GCNTRL[3:0], (iii) an input that may receive the global clock signal GCLK[3:0], (iv) an input that may receive a control signal (e.g. OCC[11:0] from the output control channel 254, (v) an input that may receive a signal from the output PIM 252, (vi) an output that may present a signal to an input of the routing channel 104 or 106, and (vii) an input/output that may be connected to a bonding pad.

Figure 13:
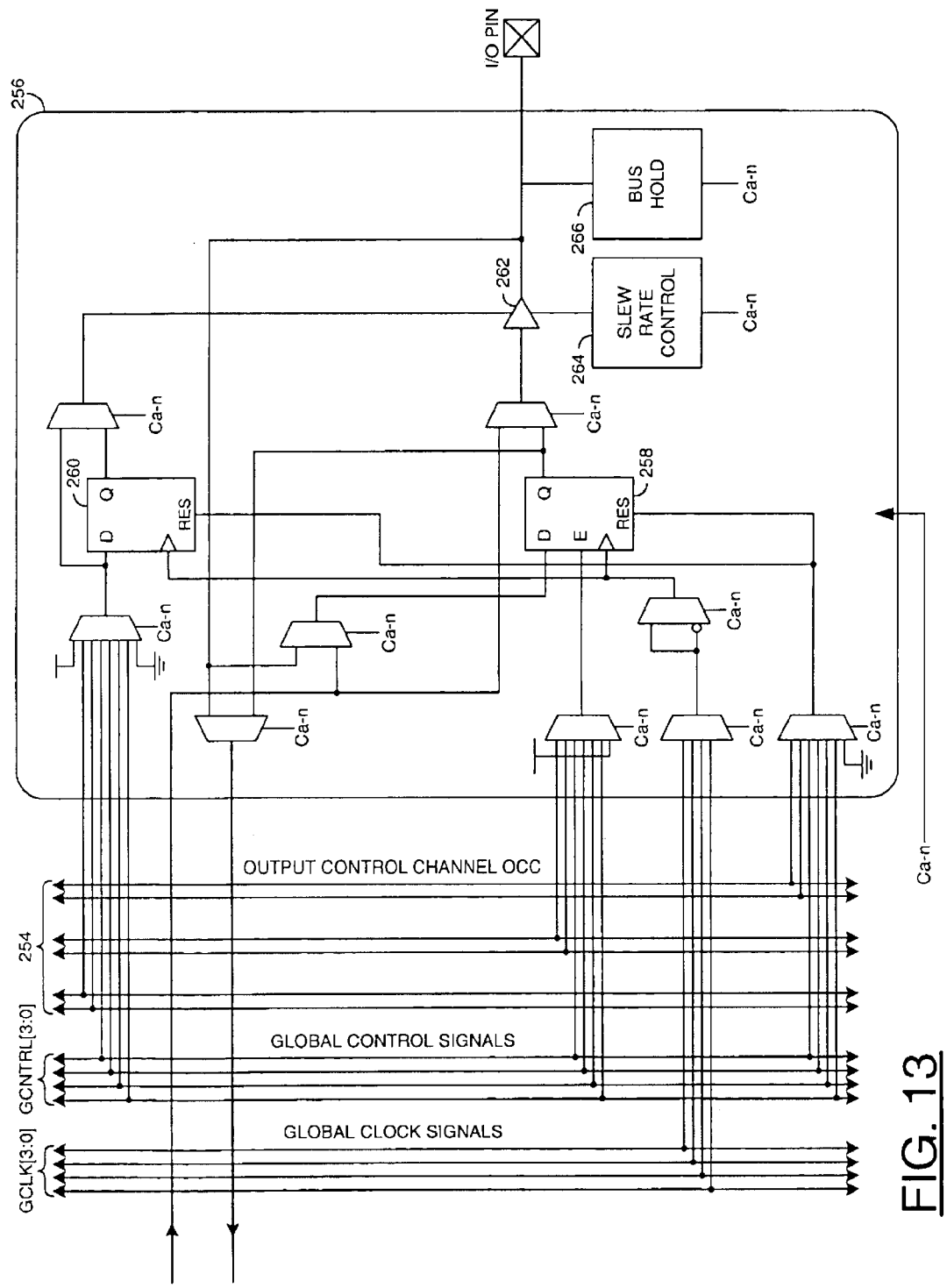
FIG. 13 is a detailed schematic of an I/O cell of FIG. 12.

Referring to FIG. 13, a block diagram of an I/O cell 256 is shown. The I/O cell 256 may comprise a register 258, an OE register 260, a tristate output buffer 262, a programmable slew rate control 264, and a programmable bus hold 266. The register 258 may be used as an input register or an output register. The OE register 260 may provide compatibility for a synchronous circuit architecture with minimal bus latency memory. The I/O cell 256 may be configured for a number of I/O standards that may include PCI, SSTL, HSTL, GTL+, LVTTL, LVCMOS, LVCMOS2, LVCMOS18, HSTL (I, II, III, IV), SSTL2 (I, II), SSTL3 (I, II).

The register 258 may have an enable input that may receive (i) one of the global I/O control signals GCNTRL[3:0], (ii) a signal from the output control channel 254 or (iii)

a supply voltage (e.g., VCC). The registers 258 and 260 may have a clock input that may receive one of the global clock signals GCLK[3:0]. The polarity of the clock signals may also be selected. The registers 258 and 260 may be reset by one of the global control signals GCNTRL[3:0] or a signal from the output control channel 254.

The tristate output buffer 262 may be enabled asynchronously or synchronously by one of the global output control signals GCNTRL[3:0] or a signal from the output control channel 254. The tristate output buffer 262 may have a slew rate control input that may receive a signal from the slew rate control circuit 264. The slew rate control circuit 264 may be configured to control the slew rate of the output buffer 262 in response to a portion of the control signal Can. The bus hold circuit 266 may be configured to present a signal to the output of the macrocell 256 in response to a portion of the signal $C_{a-n}$.

Figure 14:
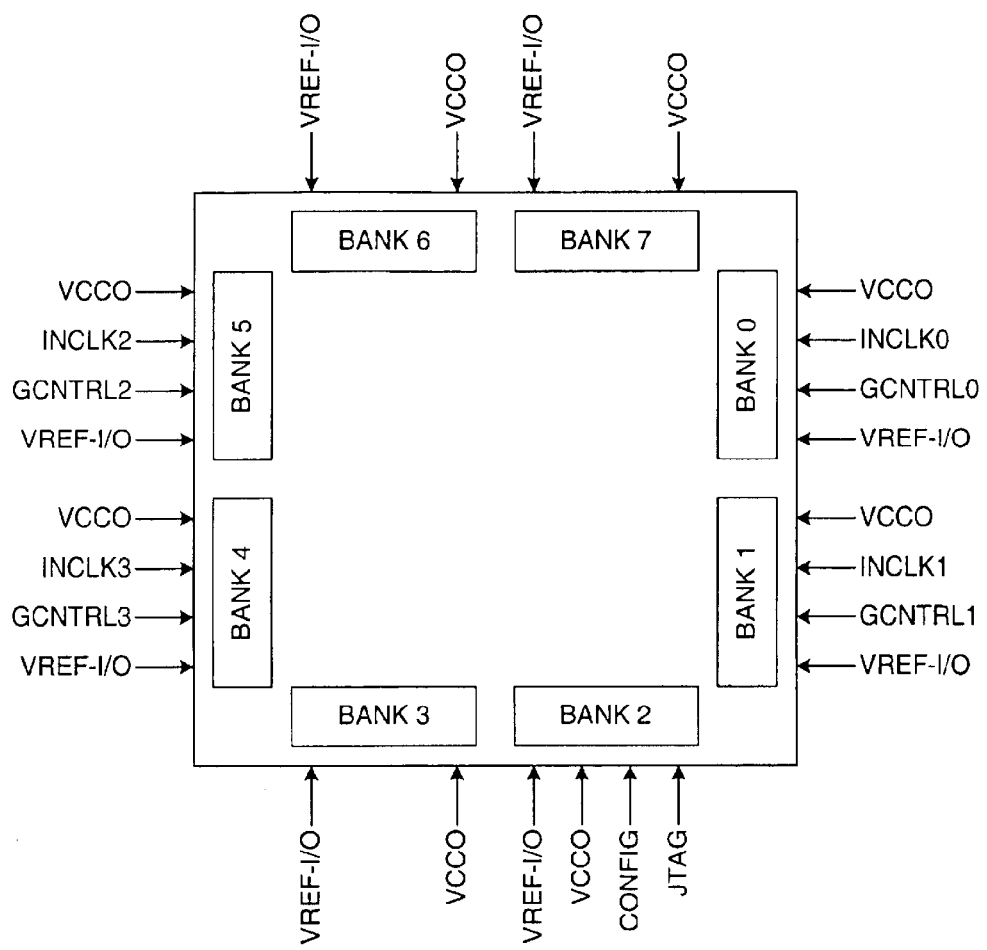
FIG. 14 is a block diagram illustrating I/O blocks of FIG. 1 combined to form I/O banks.

Referring to FIG. 14, a block diagram of the PLD 100 illustrating the grouping of I/O blocks into I/O banks. The separate I/O blocks allow for improved design "fitting", pinout flexibility, and I/O performance. The I/O blocks may be combined to form I/O banks that may be configured to support all of the current I/O standards within the 1.5V to 3.3V range. Each I/O bank may have an independent supply voltage input (e.g., VCCO) and a voltage reference input (e.g., VREF). I/O cells within a bank may be configured for different standards that (i) have a common VCCO, and (ii) have a common VREF. I/O standards that generally do not require a VREF may coexist with standards that do need a VREF. When a VREF is not required, the pin may be configured as an input or output.

While the invention has been particularly shown and described with reference to the preferred embodiments thereof, it will be understood by those skilled in the art that various changes in form and details may be made without departing from the spirit and scope of the invention. For example, the size and number of logic blocks, logic block arrays, single port RAM, dual port RAM, aft FIFO RAM, I/O blocks, PLLs, and routing channels could be smaller or larger. The architecture could be extended to more levels of hierarchy, for example, there could be groups of logic block arrays that could be connected with another level of vertical and horizontal routing. The architecture may be constructed without some of the base components like the PLL 110, the regulator, the memory 116, or the memory 130.

What is claimed is:

1. A programmable logic device comprising:
   one or more horizontal routing channels;
   one or more vertical routing channels;
   one or more logic elements each configured to (i) receive one or more inputs from one of said horizontal routing channels and one of said vertical routing channels and (ii) present one or more outputs to said horizontal routing channel and said vertical routing channel, wherein each of said logic elements comprises (i) a logic block array and (ii) an interconnect matrix coupled to said logic block array, said horizontal routing channel and said vertical routing channel, and
   a memory block configured to (i) receive one or more inputs from and (ii) present one or more outputs to either (a) said interconnect matrix or (b) said horizontal routing channel and said vertical routing channel.

2. The programmable logic device according to claim 1, wherein said memory block comprises a first port connected to one of said horizontal routing channels and a second port connected to one of said vertical routing channels.

3. The programmable logic device according to claim 2, wherein said memory block is configured as a synchronous dual port memory.

4. The programmable logic device according to claim 2, wherein said memory block is configured as an asynchronous dual port memory.

5. The programmable logic device according to claim 2, wherein said memory block is configured as a synchronous FIFO memory.

6. The programmable logic device of claim 1, wherein said memory block is coupled to said interconnect matrix.

7. The programmable logic device of claim 1, further comprising a plurality of I/O blocks, wherein each I/O block of said plurality of I/O blocks is connected to a different end of said horizontal and said vertical routing channels.

8. The programmable logic device of claim 7, wherein said I/O blocks are grouped into I/O banks.

9. The programmable logic device of claim 7, wherein said I/O blocks comprise configurable I/O cells.

10. The programmable logic device of claim 1, further comprising one or more dedicated inputs for I/O cell control.

11. The programmable logic device of claim 1, further comprising one or more dedicated clock inputs.

12. The programmable logic device of claim 11, further comprising a phase lock loop circuit configured to generate one or more global clock signals in response to one or more input clock signals.

13. The programmable logic device of claim 10, wherein said dedicated inputs for I/O control comprise a reset input.

14. The programmable logic device of claim 10, wherein said dedicated inputs for I/O control comprise an output unable input.

15. The programmable logic device of claim 10, wherein said dedicated inputs for I/O control comprise a clock enable input.

16. The programmable logic device of claim 11, further comprising a phase lock loop circuit configured to generate one or more global clock signals by multiplying or dividing a frequency of a clock signal presented to said one or more dedicated clock inputs.

17. The programmable logic device of claim 1, wherein said logic block array comprises a plurality of logic blocks.

18. The programmable logic device of claim 17, wherein each logic block of said logic block array comprises a product term array configured to receive inputs from said interconnect matrix.

19. The programmable logic device of claim 18, wherein each of said logic blocks further comprise a plurality of macrocells each having an output coupled to said interconnect matrix.

20. The programmable logic device of claim 19, wherein each of said logic blocks further comprises an OR array coupling said product term array to said plurality of macrocells.

21. The programmable logic device of claim 1, wherein said interconnect matrix comprises a programmable interconnect matrix.

22. The programmable logic device of claim 6, wherein said interconnect matrix couples said memory block to one of said horizontal routing channels, one of said vertical routing channels, and said logic block array.

23. The programmable logic device of claim 1, comprising a plurality of horizontal routing channels and a plurality of vertical routing channels.

24. The programmable logic device of claim 1, comprising a plurality of logic elements.

25. The programmable logic device of claim 23, comprising at least four logic elements.

26. A programmable logic device comprising:
   a plurality of horizontal routing channels;
   a plurality of vertical routing channels;
   a plurality of first memory blocks; and
   a plurality of logic block arrays, wherein each of said plurality of first memory blocks and each of said plurality of logic block arrays is configured to (i) receive one or more inputs from one of said plurality of horizontal routing channels and one of said plurality of vertical routing channels and (ii) present one or more outputs to said horizontal routing channel and said vertical routing channel.

27. The programmable logic device according to claim 26, wherein each of said first memory blocks comprises a first port connected to one of said horizontal routing channels and a second port connected to one of said vertical routing channels.

28. The programmable logic device according to claim 26, wherein each of said first memory blocks is configurable to a mode selected from the group consisting of (i) an asynchronous dual port memory mode, (ii) a synchronous dual port memory mode, and (iii) a synchronous FIFO memory mode.

29. The programmable logic device of claim 26, wherein each of said logic block arrays comprises a plurality of programmably interconnected logic blocks, and each of said logic blocks comprises a plurality of macrocells.

30. The programmable logic device of claim 26, comprising:
   M number of horizontal routing channels;
   N number of vertical routing channels;
   N times M number of first memory blocks; and
   N times M number of logic block arrays, wherein N plus M is greater than or equal to 2.

31. The programmable logic device of claim 26, wherein each of said logic block arrays further comprises an interconnect matrix coupled to said horizontal routing channel and said vertical routing channel.

32. The programmable logic device of claim 31, wherein each of said logic block arrays further comprises a second memory block coupled to said interconnect matrix.

* * * * *